United States Patent
Chang et al.

(10) Patent No.: US 9,788,425 B2
(45) Date of Patent: Oct. 10, 2017

(54) ELECTRONIC PACKAGE ASSEMBLY

(71) Applicant: VIA Alliance Semiconductor Co., Ltd., Shanghai (CN)

(72) Inventors: Nai-Shung Chang, New Taipei (TW); Wen-Yuan Chang, New Taipei (TW); Kuo-Ying Tsai, New Taipei (TW)

(73) Assignee: VIA ALLIANCE SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 14/958,031

(22) Filed: Dec. 3, 2015

(65) Prior Publication Data

US 2016/0302306 A1 Oct. 13, 2016

Related U.S. Application Data

(60) Provisional application No. 62/145,208, filed on Apr. 9, 2015.

(30) Foreign Application Priority Data

Jul. 24, 2015 (TW) .............................. 104124007 A

(51) Int. Cl.
*H05K 1/11* (2006.01)
*H05K 1/14* (2006.01)
(Continued)

(52) U.S. Cl.
CPC .............. *H05K 1/111* (2013.01); *H01L 25/00* (2013.01); *H05K 1/141* (2013.01);
(Continued)

(58) Field of Classification Search
CPC ...... H05K 1/111; H05K 1/181; H05K 1/0204; H05K 2201/10977; H05K 1/14;
(Continued)

(56) References Cited

U.S. PATENT DOCUMENTS 7,928,552 B1 * 4/2011 Cho ...................... H01L 21/565
257/686
8,270,176 B2 * 9/2012 Pagaila ................ H01L 23/3128
361/760
(Continued)

FOREIGN PATENT DOCUMENTS

CN 2562369 Y 7/2003
CN 102543973 7/2012
(Continued)

OTHER PUBLICATIONS

Chinese language office action dated Dec. 1, 2016, issued in application No. TW 104124007.

*Primary Examiner* — Hoa C Nguyen
(74) *Attorney, Agent, or Firm* — McClure, Qualey & Rodack, LLP

(57) ABSTRACT

An electronic package assembly is provided. The electronic package assembly includes a package substrate having a first surface and a second surface opposite thereto. A plurality of conductive pads is disposed on the first surface. A chip is mounted onto the first surface of the package substrate. A circuit board is mounted onto the second surface of the package substrate, and includes an electrical connector. A plurality of electrical contact components is electrically connected to the electrical connector and is in contact with the plurality of conductive pads.

11 Claims, 9 Drawing Sheets

(51) Int. Cl.
*H01L 25/00* (2006.01)
*H05K 1/02* (2006.01)
*H05K 3/34* (2006.01)

(52) U.S. Cl.
CPC ............ *H01L 2224/16225* (2013.01); *H01L 2924/15311* (2013.01); *H01L 2924/181* (2013.01); *H05K 1/0204* (2013.01); *H05K 1/144* (2013.01); *H05K 3/3436* (2013.01); *H05K 2201/09381* (2013.01); *H05K 2201/10992* (2013.01); *Y02P 70/611* (2015.11)

(58) Field of Classification Search
CPC ........ H05K 1/141; H05K 1/142; H05K 1/144; H05K 1/145
See application file for complete search history.

(56) References Cited

U.S. PATENT DOCUMENTS

| | | | |
|---|---|---|---|
| 9,000,573 B2 | 4/2015 | Chen et al. | |
| 9,267,985 B2 | 2/2016 | Hata | |
| 2006/0284299 A1* | 12/2006 | Karnezos | H01L 23/3128 257/686 |
| 2008/0057756 A1* | 3/2008 | Kim | H01R 12/58 439/84 |
| 2008/0106294 A1* | 5/2008 | Smith | G01R 31/2889 324/750.16 |
| 2009/0032969 A1* | 2/2009 | Pilla | H01L 24/49 257/777 |
| 2009/0102500 A1* | 4/2009 | An | H01R 12/714 324/755.02 |
| 2010/0051707 A1* | 3/2010 | Conzelmann | G01K 3/04 235/494 |
| 2012/0024584 A1* | 2/2012 | Lee | H05K 3/4092 174/261 |
| 2013/0175681 A1 | 7/2013 | Chang et al. | |
| 2015/0123690 A1 | 5/2015 | Kung et al. | |
| 2015/0195906 A1 | 7/2015 | Chang et al. | |
| 2016/0066426 A1* | 3/2016 | Chen | H01L 21/565 361/820 |

FOREIGN PATENT DOCUMENTS

| | | |
|---|---|---|
| CN | 102576685 A | 7/2012 |
| CN | 103632988 A | 3/2014 |
| CN | 103698561 | 4/2014 |
| CN | 103889145 | 6/2014 |
| TW | 491522 | 6/2002 |

* cited by examiner

US 9,788,425 B2

ELECTRONIC PACKAGE ASSEMBLY

CROSS REFERENCE TO RELATED APPLICATIONS

This application claims the benefit of U.S. Provisional Application No. 62/145,208, filed Apr. 9, 2015, and priority of Taiwan Patent Application No. 104124007 filed on Jul. 24, 2015, entitled "ELECTRONIC PACKAGE ASSEMBLY", the entirety of which are hereby incorporated herein by reference.

BACKGROUND

Field of the Disclosure

The present disclosure relates to an electronic package technology, and in particular, it relates to an electronic package assembly having an additional electric channel.

Description of the Related Art

As the science and technology of electronics evolves, various electronic package types, such as a pin grid array (PGA) and a ball grid array (BGA), have been developed for use with the current semiconductor package technology. In such an electronic package type (e.g., BGA), a chip with a BGA may be mounted onto the top surface of a package substrate by flip chip method. Next, the structure is mounted onto a printed circuit board (PCB) through another BGA disposed on the bottom surface of the package substrate, thereby forming an electronic package assembly for electronic products.

In order to meet market demand, there is a need to reduce the size and increase the functionality of electronic products. However, by increasing the functionality of electronic products, the integration density of integrated circuits (ICs) used in the chip must also be increased. As a result, the number of input/output (I/O) pads in a chip package is greatly increased. It is necessary to additionally increase the size of the electronic package assembly and/or the package substrate in the chip package in response to the incremental increase in the number of I/O pads. Therefore, it is difficult to develop thin and lightweight electronic products without also increasing the manufacturing cost. That is, the current structure of the electronic package assembly has been insufficient to meet demand.

Therefore, there is a need to develop a novel structure for the electronic package assembly that is capable of addressing the problems described above.

SUMMARY

In an embodiment of the disclosure, an electronic package assembly is provided. The electronic package assembly includes a package substrate having a first surface and a second surface opposite thereto. A plurality of conductive pads is disposed on the first surface. A chip is mounted onto the first surface of the package substrate. A circuit board is mounted onto the second surface of the package substrate, and includes an electrical connector. A plurality of electrical contact components is electrically connected to the electrical connector and is in contact with the plurality of conductive pads.

In another embodiment of the disclosure, an electronic package assembly is provided. The electronic package assembly includes a package substrate having a first surface and a second surface opposite thereto. A chip is mounted onto the first surface of the package substrate and an encapsulation layer covers the chip and the package substrate. The encapsulation layer has a plurality of conductive pads disposed on a surface thereof and is electrically connected to the chip. A circuit board is mounted onto the second surface of the package substrate, and includes an electrical connector. A plurality of electrical contact components is electrically connected to the electrical connector and is in contact with the plurality of conductive pads.

A detailed description is given in the following embodiments with reference to the accompanying drawings.

BRIEF DESCRIPTION OF THE DRAWINGS

The present disclosure can be further understood by reading the subsequent detailed description and examples with references made to the accompanying drawings, wherein.

DETAILED DESCRIPTION

Figure 1:
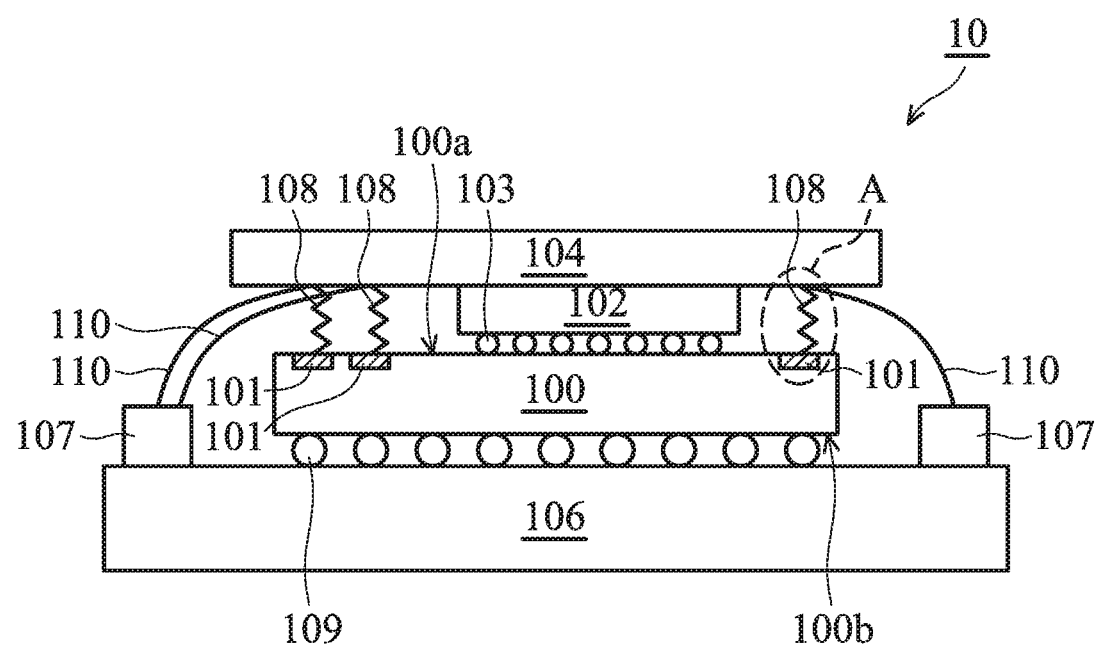
FIG. 1 shows a cross section of an electronic package assembly according to an embodiment of the present disclosure.

The following description is of the best-contemplated mode of carrying out the disclosure. This description is made for the purpose of illustrating the general principles of the disclosure and should not be taken in a limiting sense. These are, of course, merely examples and are not intended to be limited. In addition, the disclosure may repeat reference numerals and/or letters in the various examples. This repetition is for the purpose of simplicity and clarity and does not in itself dictate a relationship between the various embodiments and/or configurations discussed.

Refer to FIG. 1, which illustrates a cross section of an electronic package assembly 10 according to an embodiment of the present disclosure. In the embodiment, the electronic package assembly 10 includes a package substrate 100 having a first surface 100a and a second surface 100b, in which the second surface 100b is opposite the first surface 100a. In one embodiment, the package substrate 100 may include a silicon material or other semiconductor materials. In some embodiments, the package substrate 100 may include a polymer material, a ceramic material or other well-known materials for the package substrate. In the embodiment, the first surface 100a of the package substrate 100 includes a chip region (not shown). Moreover, the package substrate 100 includes a plurality of conductive pads 101 on the first surface 100a outside of the chip region, to act as contacts for electrical connection between the package substrate 100 and external circuits. In one embodiment, the plurality of conductive pads 101 may include power pads, ground pads, or signal pads. In the embodiment, the second surface 100b of the package substrate 100 may include a plurality of bumps 109 (e.g., solder balls) disposed thereon, in which the bumps 109 also act as contacts for electrical connection between the package substrate 100 and external circuits. Similarly, such contacts may include power pads, ground pads, or signal pads.

In the embodiment, the electronic package assembly 10 further includes a chip 102 including a plurality of bumps 103 (e.g., solder balls) disposed on the surface thereof. The chip 102 is mounted onto the first surface 100a of the package substrate 100 corresponding to the chip region, by the flip chip method using the plurality of bumps 103, such that circuits in the chip 102 are electrically connected to the plurality of conductive pads 101 through the plurality of bumps 103 and the interconnect structure (not shown) in the package substrate 100.

In the embodiment, the electronic package assembly 10 further includes a cover plate 104 disposed over the chip 102 and opposite the plurality of bumps 103. Moreover, the cover plate 104 extends above the plurality of conductive pads 101 to cover and/or protect the underlying chip 102 and package substrate 100. In one embodiment, the cover plate 104 may include a heat sink and be in direct or indirect contact with the chip 102, so as to provide the function of heat dissipation for the chip 102. In some embodiments, the cover plate 104 may include a circuit board (e.g., a PCB) or a land grid array (LGA) socket that is electrically connected to the chip 102, so as to act as an electrical connection media between the chip 102 and external circuit(s).

In the embodiment, the electronic package assembly 10 further includes a circuit board 106, such as a PCB. The package substrate 100 utilizes the plurality of bumps 109 (e.g., solder balls) disposed on the second surface 100b thereof for mounting the circuit board 106 onto the second surface 100b of the package substrate 100 and forming an electrical connection therebetween. The circuit board 106 may include one or more electrical contact connectors 107 disposed on the circuit board 106 outside of the package substrate 100, so as to act as an electrical connection media between the circuit board 106 and external circuits.

In the embodiment, the electronic package assembly 10 further includes a plurality of electrical contact components 108 that is disposed between the package substrate 100 and the cover plate 104. The number of electrical contact components 108 is based on the number of conductive pads 101. In the embodiment, one end of the plurality of electrical contact components 108 may be fixed on a portion of the cover plate 104 that extends above the plurality of conductive pads 101 or in physical contact with the cover plate 104. Moreover, the other end of the plurality of electrical contact components 108 is in physical contact with the plurality of corresponding conductive pads 101 by the weight of the cover plate 104 itself. In some embodiments, the plurality of electrical contact components 108 may be fixed on the plurality of conductive pads 101. In the embodiment, each of the plurality of electrical contact components 108 is electrically connected to the electrical contact connector 107 through a conductive line structure 110, such that a conductive pad 101, an electrical contact component 108, a conductive line structure 110, and an electrical contact connector 107 constitute an additional conductive path between the chip 102 and the circuit board 106. In one embodiment, the conductive line structure 110 may include a flat cable, a flexible flat cable, or a conductive wire.

Figure 2A:
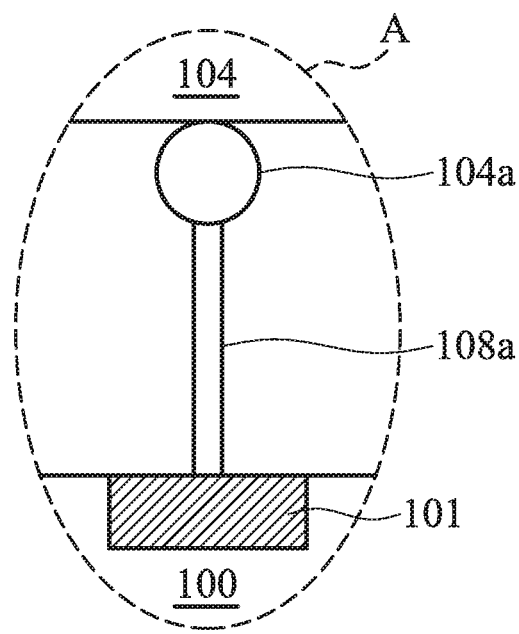
FIGS. 2A to 2F show various enlarged cross sections of an enclosed portion A in FIG. 1 according to some embodiments of the present disclosure.

Refer to FIGS. 2A to 2F, which illustrate various enlarged cross sections of an enclosed portion A in FIG. 1 according to some embodiments of the present disclosure. The enclosed portion A shows a cross section of the electrical contact components 108. In one embodiment, the electrical contact component 108 may be a pin 108a, as shown in FIG. 2A. In this case, one end of the pin 108a may be fixed on or connected to the cover plate 104 through a conductor 104a, such as a solder ball. Moreover, the other end of the pin 108a can contact the conductive pad 101 without slipping off, by a downward force provided by the weight of the cover plate 104.

Figure 2B:
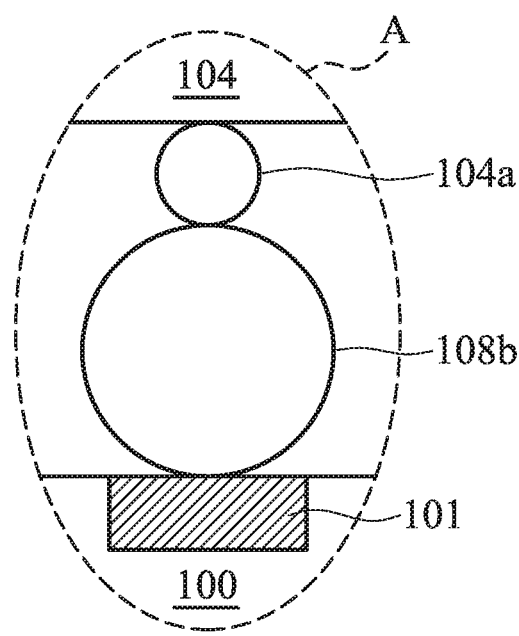

In some embodiments, the electrical contact component 108 may be a solder ball 108b, as shown in FIG. 2B. In this case, one end of the solder ball 108b may be fixed on or connected to the cover plate 104 through a conductor 104a, such as a solder ball. Similarly, the other end of the solder ball 108b can contact the conductive pad 101 without slipping off, by a downward force provided by the weight of the cover plate 104. Additionally, the other end of the solder ball 108b can also be fixed on or connected to the conductive pad 101, such that the conductor 104a can contact the solder ball 108b without slipping off, by a downward force provided by the weight of the cover plate 104.

Figure 2C:
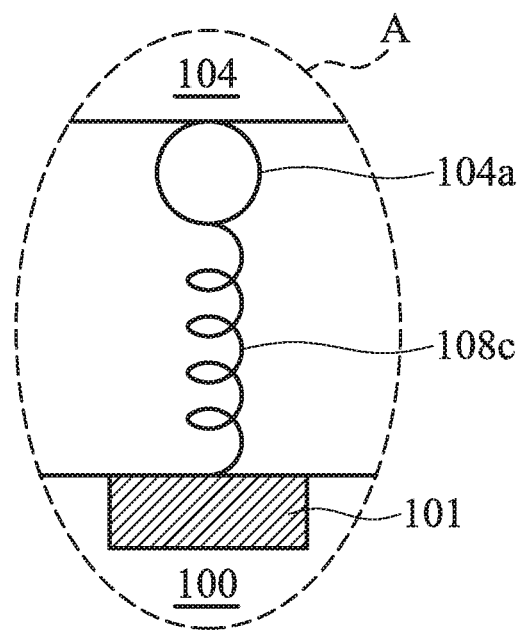

In some embodiments, the electrical contact component 108 may be an elastic component, as shown in FIGS. 2C to 2F. In an example, the electrical contact component 108 may be a spring 108c, as shown in FIG. 2C. One end of the spring 108c may be fixed on or connected to the cover plate 104 through a conductor 104a, such as a solder ball. Similarly, the other end of the spring 108c can contact the conductive pad 101 without slipping off, by a downward force provided by the weight of the cover plate 104 and an elastic force provided by the spring 108c itself.

Figure 2D:
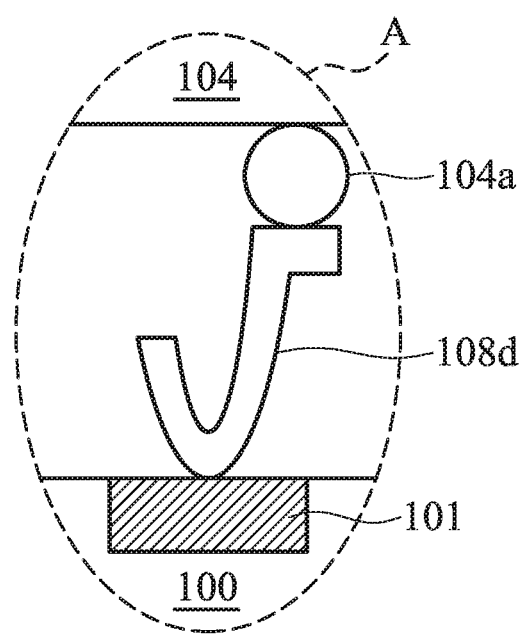

In some examples, the electrical contact component 108 may be a spring sheet 108d, as shown in FIG. 2D. The case of the spring sheet 108d is similar to that of the spring 108c shown in FIG. 2C. Namely, one end of the spring sheet 108d may be fixed on or connected to the cover plate 104 through a conductor 104a, such as a solder ball. Moreover, the other end of the spring sheet 108d can contact the conductive pad 101 without slipping off, by a downward force provided by the weight of the cover plate 104 and an elastic force provided by the spring sheet 108d itself.

Figure 2E:
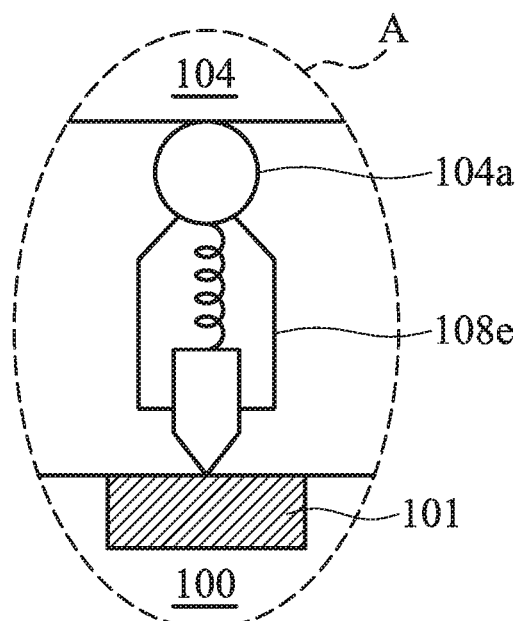

In some examples, the electrical contact component 108 may be a retractable slider, such as a pogo pin 108e, as shown in FIG. 2E. The case of the pogo pin 108e is similar to that of the spring 108c shown in FIG. 2C. Namely, one end of the pogo pin 108e may be fixed on or connected to the cover plate 104 through a conductor 104a, such as a solder ball. Moreover, the other end of the spring sheet 108d can contact the conductive pad 101 without slipping off, by a downward force provided by the weight of the cover plate 104 and an elastic force provided by the pogo pin 108e itself.

Figure 2F:
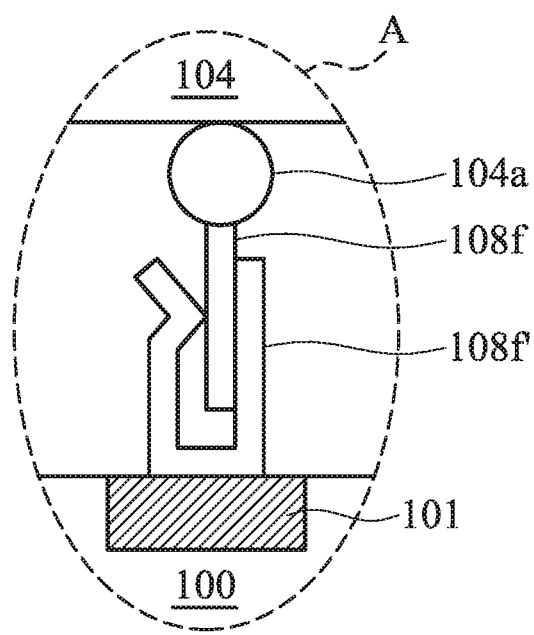

In some examples, the electrical contact component 108 may be a combination structure of a pin 108f and a socket 108f, as shown in FIG. 2F. In this structure, one end of the socket 108f' may be fixed to the conductive pad 101. Moreover, one end of the pin 108f may be fixed on or connected to the cover plate 104 through a conductor 104a, such as a solder ball. The other end of the pin 108f can be fixed in the socket 108f' without slipping off, by a downward force provided by the weight of the cover plate 104 and an elastic force provided by the socket 108f' itself. It should be understood that the pin 108f and the socket 108f' can be exchanged, so that the socket 108f' is fixed on the cover plate 104, while the pin 108f is fixed on the conductive pad 101. Moreover, in some examples, other types of sockets can be used to replace the socket 108f. According to the foregoing embodiments, the electrical contact component 108 may be an elastic or non-elastic component that is capable of increasing the choice of available electrical contact components, thereby increasing the manufacturing flexibility of the electronic package assembly.

Figure 3A:
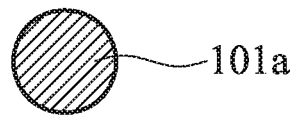
FIGS. 3A and 3H show various plan views of a conductive pad in FIG. 1 according to some embodiments of the present disclosure.
Figure 3B:
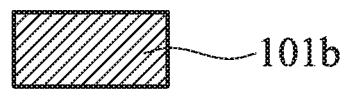
Figure 3C:
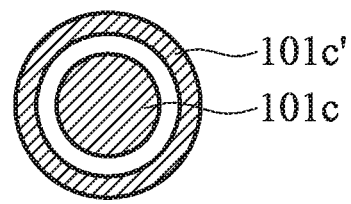
Figure 3D:
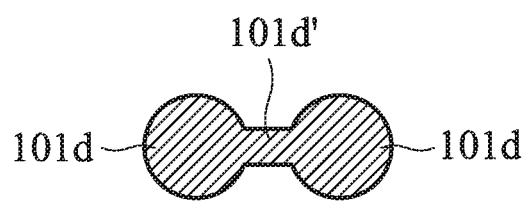
Figure 3E:
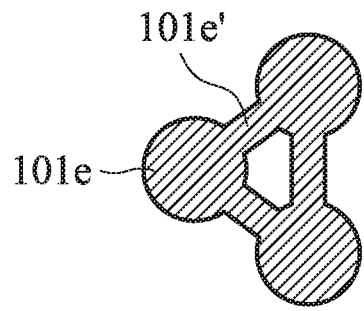
Figure 3F:
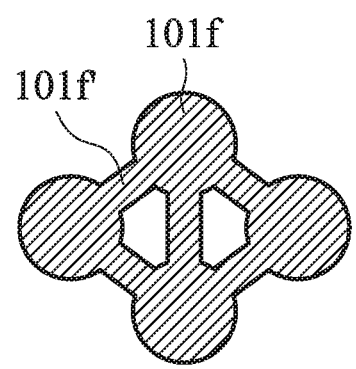
Figure 3G:
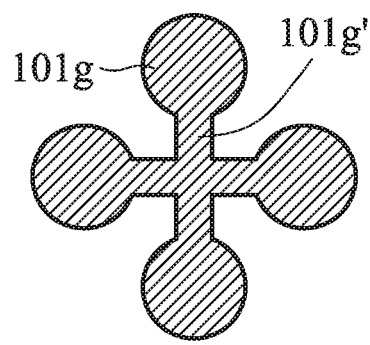
Figure 3H:
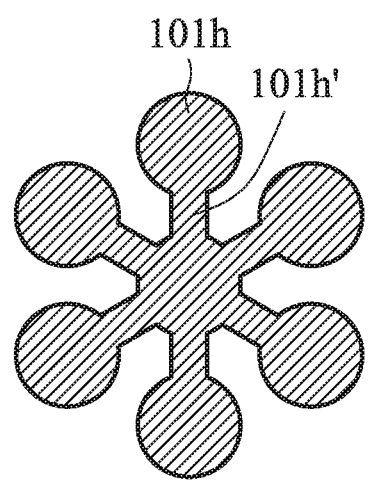

Refer to FIGS. 3A to 3H, which illustrate various plan views of a conductive pad 101 in FIG. 1 according to some embodiments of the present disclosure. In one embodiment, the conductive pad 101 may include a circular portion 101a that has a circular contour as viewed from a top-view perspective, as shown in FIG. 3A. In some embodiments, the conductive pad 101 may include a rectangular portion 101b that has a rectangular contour as viewed from a top-view perspective, as shown in FIG. 3B. In some embodiments, the conductive pad 101 may include a circular portion 101c and a ring portion 101c' surrounding the circular portion 101c that have a combination of circular and ring contours as viewed from a top-view perspective, as shown in FIG. 3C. It should be understood that the conductive pad 101 may include a rectangular portion and a ring portion surrounding the rectangular portion according to another embodiment. In some embodiments, the conductive pad 101 may include circular portions 101d and a bridging portion 101d' connecting the circular portions 101d, to form a combination with a linear contour as viewed from a top-view perspective, as shown in FIG. 3D. In some embodiments, the conductive pad 101 may include circular portions 101e and bridging portions 101e' connecting the circular portions 101e, to form a combination with a triangular contour as viewed from a top-view perspective, as shown in FIG. 3E. In some embodiments, the conductive pad 101 may include circular portions 101f and bridging portions 101f' connecting the circular portions 101f, to form a combination with an "8" contour as viewed from a top-view perspective, as shown in FIG. 3F. In some embodiments, the conductive pad 101 may include circular portions 101g and bridging portions 101g' connecting the circular portions 101g, to form a combination with a cross contour as viewed from a top-view perspective, as shown in FIG. 3G. In some embodiments, the conductive pad 101 may include circular portions 101h and bridging portions 101h' connecting the circular portions 101h, to form a combination with a snowflake contour as viewed from a top-view perspective, as shown in FIG. 3H. According to the foregoing embodiments, contact between the electrical contact component 108 and the corresponding conductive pad 101 can be improved further by the various contour designs of the conductive pad as viewed from a top-view perspective, thereby increasing the reliability of the electronic package assembly.

Figure 4:
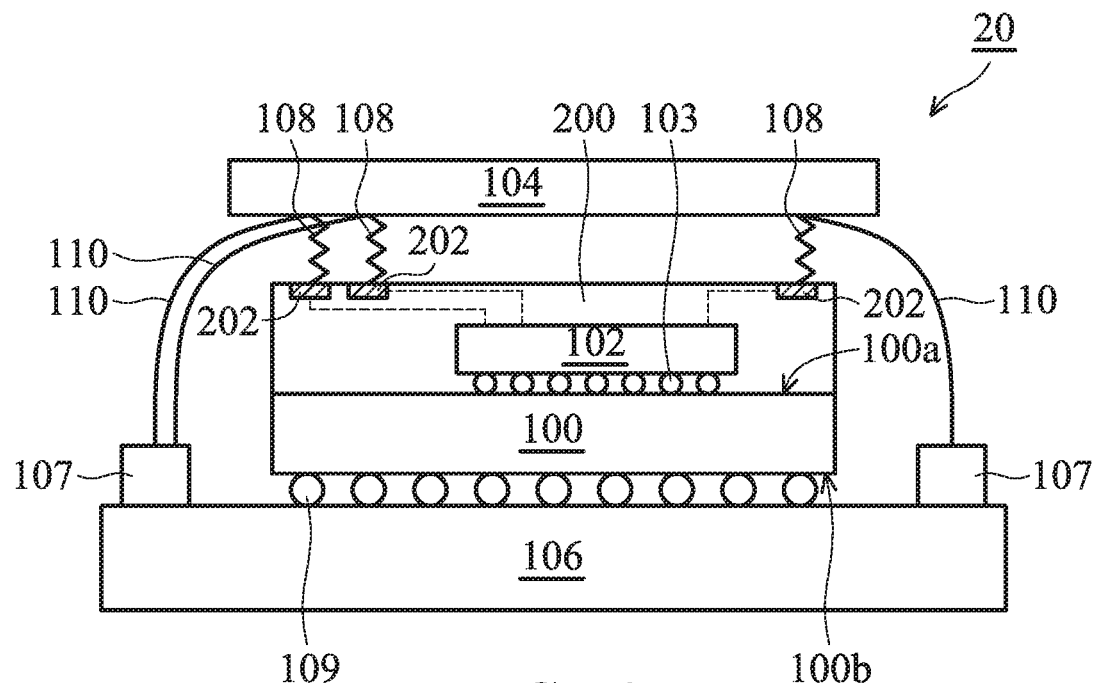
FIG. 4 shows a cross section of an electronic package assembly according to another embodiment of the present disclosure.

Refer to FIG. 4, which illustrates a cross section of an electronic package assembly 20 according to another embodiment of the present disclosure. Elements in FIG. 4 that are the same as or similar to those in FIG. 1 are not described again, for brevity. In this embodiment, the structure of electronic package assembly 20 is similar to the structure of electronic package assembly 10 shown in FIG. 1, except that the electronic package assembly 20 also includes an encapsulation layer 200 (e.g., a molding compound layer) that covers the chip 102 and the package substrate 100. Moreover, the surface of the encapsulation layer 200 has a plurality of conductive pads 202 that is in contact with the electrical contact component 108 instead of the plurality of conductive pads 101 of the electronic package assembly 10 shown in FIG. 1. In this embodiment, the plurality of conductive pads 202 is electrically connected to the chip 102 by an interconnect structure (as indicated by the dash lines shown in FIG. 4) in the encapsulation layer 200. Namely, the package substrate 100 is not used for the electrical connection between the plurality of conductive pads 202 and the chip 102. Furthermore, conductive pad 202, an electrical contact component 108, a conductive line structure 110, and an electrical contact connector 107 constitute an additional conductive path between the chip 102 and the circuit board 106.

In this embodiment, the cover plate 104 may include a heat sink or a circuit board. Moreover, it should be understood that the structure and configuration of the electrical contact component 108 may include those of the embodiments shown in FIGS. 2A to 2F. Similarly, the conductive pad 202 has a contour as viewed from a top-view perspective that may be the same as or similar to that of the conductive pad 101 shown in FIGS. 3A to 3H. For the purpose of conciseness, the descriptions are not repeated herein.

Figure 5:
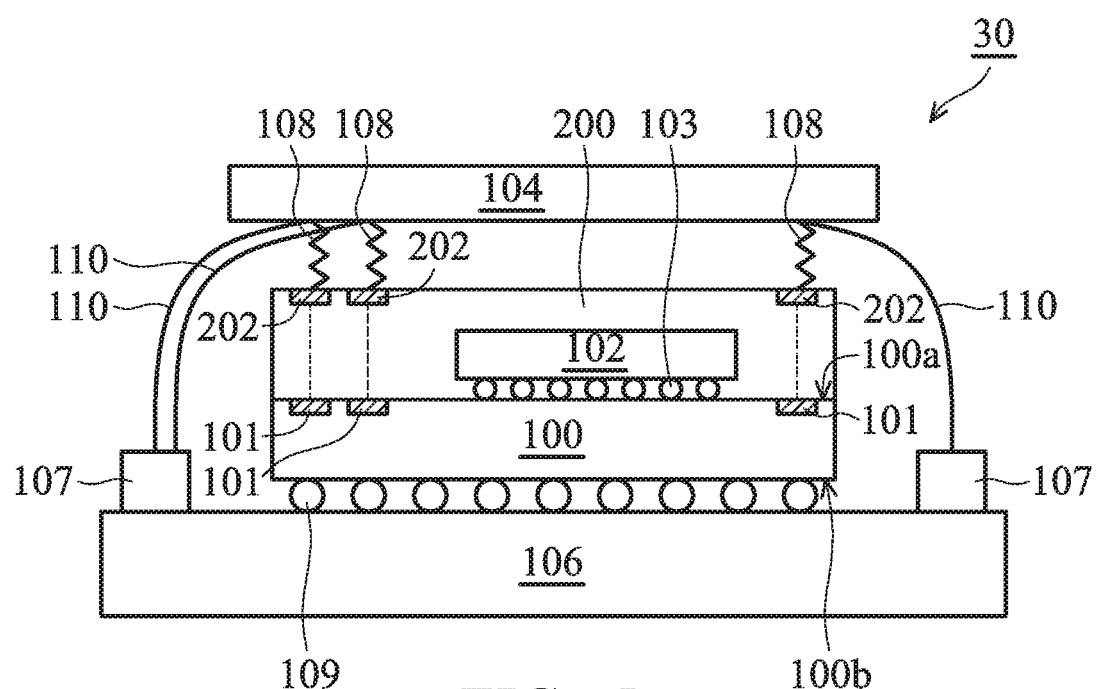
FIG. 5 shows a cross section of an electronic package assembly according to yet another embodiment of the present disclosure.

Refer to FIG. 5, which illustrates a cross section of an electronic package assembly 30 according to yet another embodiment of the present disclosure. Elements in FIG. 5 that are the same as or similar to those in FIGS. 1 and 4 are not described again, for brevity. In this embodiment, the structure of electronic package assembly 30 is similar to the structure of electronic package assembly 20 shown in FIG. 4. The difference is that the electronic package assembly 30 includes a plurality of conductive pads 101 disposed on the first surface 100a thereof. Moreover, a plurality of conductive pads 202 disposed on the surface of the encapsulation layer 200 is electrically connected to the plurality of conductive pads 101 of the package substrate 100 by an interconnect structure (as indicated by the dash lines shown in FIG. 5) in the encapsulation layer 200. Namely, the package substrate 100 is used for the electrical connection between the plurality of conductive pads 202 and the chip 102. Furthermore, conductive pads 101 and 202, an electrical contact component 108, a conductive line structure 110, and an electrical contact connector 107 constitute an additional conductive path between the chip 102 and the circuit board 106.

In this embodiment, it should be understood that the structure and configuration of the electrical contact component 108 may include those of the embodiments shown in FIGS. 2A to 2F. Similarly, the conductive pad 202 has a contour as viewed from a top-view perspective that may be the same as or similar to that of the conductive pad 101 shown in FIGS. 3A to 3H. For the purpose of conciseness, the descriptions are not repeated herein.

According to the foregoing embodiments, since there are additional conductive pads disposed on the surface of the package substrate and/or the encapsulation layer in the electronic package assembly, the number of I/O pads can still be increased in application without increasing the size of the package substrate when the chip has a high integration density. As a result, as the demand for increased functionality of electronic products increases, the electronic package assembly allows for continuously developing thin and lightweight electronic products while also reducing the manufacturing cost of the electronic products. Moreover, a conductive path with high reliability and low cost can be accomplished by using the electrical contact component that is disposed between the cover plate and the package substrate or the encapsulation layer, thereby easily creating an electrical connection between the chip and the external circuits.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic package assembly, comprising:
   a package substrate having a first surface and a second surface opposite thereto;
   a chip mounted onto the first surface of the package substrate;
   an encapsulation layer covering the chip and the package substrate, wherein the encapsulation layer has a plurality of conductive pads disposed on a surface thereof and electrically connected to the chip;
   a circuit board mounted onto the second surface of the package substrate, and including an electrical connector, wherein the electrical connector is disposed on the circuit board outside of the package substrate as viewed from a top-view perspective; and
   a plurality of electrical contact components electrically connected to the electrical connector and in contact with the plurality of conductive pads, wherein the plurality of electrical contact components and at least a portion of a top surface of the circuit board are uncovered by the encapsulation layer.

2. The electronic package assembly as claimed in claim 1, further comprising a cover plate disposed on the encapsulation layer, wherein the plurality of electrical contact components is contact with the cover plate.

3. The electronic package assembly as claimed in claim 2, wherein the cover plate comprises a heat sink or a circuit board.

4. The electronic package assembly as claimed in claim 2, wherein one end of the electrical contact component is fixed on the cover plate.

5. The electronic package assembly as claimed in claim 1, wherein the electrical connector is electrically connected to the plurality of electrical contact components through a flat cable, a flexible flat cable, or a conductive wire, wherein the flat cable, the flexible flat cable, or the conductive wire is outside of the encapsulation layer as viewed from a top-view perspective and connects with the electrical connector and the electrical contact components.

6. The electronic package assembly as claimed in claim 1, wherein the package substrate has a plurality of second conductive pads disposed on the first surface thereof, and wherein the plurality of conductive pads is electrically connected to the chip by the plurality of second conductive pads.

7. The electronic package assembly as claimed in claim 1, wherein the electrical contact component comprises an elastic component.

8. The electronic package assembly as claimed in claim 7, wherein the elastic component comprises a spring, a spring sheet, a pogo pin, or a combination structure of a pin and a socket.

9. The electronic package assembly as claimed in claim 1, wherein the electrical contact component comprises a pin or a solder ball.

10. The electronic package assembly as claimed in claim 1, wherein each of the plurality of conductive pads has a circular contour, a rectangular contour, or a combination of circular or rectangular contour with a ring contour as viewed from a top-view perspective.

11. The electronic package assembly as claimed in claim 1, wherein each of the plurality of conductive pads includes circular portions and one or more bridging portions connecting thereto, to form a combination with a linear contour, an "8" contour, a cross contour, a triangular contour, or a snowflake contour, as viewed from a top-view perspective.

* * * * *